(12) United States Patent
Kim et al.

(10) Patent No.: US 10,720,197 B2
(45) Date of Patent: Jul. 21, 2020

(54) MEMORY DEVICE FOR SUPPORTING COMMAND BUS TRAINING MODE AND METHOD OF OPERATING THE SAME

(71) Applicant: Samsung Electronics Co., Ltd., Suwon-si, Gyeonggi-do (KR)

(72) Inventors: Young-hun Kim, Yongin-si (KR); Si-hong Kim, Hwaseong-si (KR); Tae-young Oh, Seoul (KR); Kyung-soo Ha, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/196,777

(22) Filed: Nov. 20, 2018

(65) Prior Publication Data

US 2019/0156872 A1    May 23, 2019

Related U.S. Application Data

(60) Provisional application No. 62/734,347, filed on Sep. 21, 2018.

(30) Foreign Application Priority Data

Nov. 21, 2017  (KR) .................. 10-2017-0155812
Sep. 18, 2018  (KR) .................. 10-2018-0111604

(51) Int. Cl.
*G11C 7/22*    (2006.01)
*G11C 7/10*    (2006.01)
(Continued)

(52) U.S. Cl.
CPC ............ *G11C 7/222* (2013.01); *G11C 7/1057* (2013.01); *G11C 7/1066* (2013.01);
(Continued)

(58) Field of Classification Search
CPC ..... G11C 7/222; G11C 7/1057; G11C 7/1066; G11C 7/1093; G11C 7/1084; G11C 7/107;
(Continued)

(56) References Cited

U.S. PATENT DOCUMENTS 5,535,163 A * 7/1996 Matsui .................. G11C 29/48
                                                    365/201
7,554,353 B2    6/2009 Lee et al.
(Continued)

FOREIGN PATENT DOCUMENTS

| KR | 100734320   | 6/2007  |
|----|-------------|---------|
| KR | 20120109958 | 10/2012 |
| KR | 10170046067 | 4/2017  |

OTHER PUBLICATIONS

Korean Office Action dated Oct. 23, 2019 for corresponding Korean Application No. 10-2018-0111604 (6 pages).

*Primary Examiner* — Harry W Byrne
*Assistant Examiner* — Sultana Begum
(74) *Attorney, Agent, or Firm* — Myers Bigel, P.A.

(57) ABSTRACT

There are provided, a memory device for supporting a command bus training (CBT) mode and a method of operating the same. The memory device is configured to enter a CBT mode or exit from the CBT mode in response to a logic level of a first data signal, which is not included in second data signals, which are in one-to-one correspondence with command/address signals, which are used to output a CBT pattern in the CBT mode. The memory device is further configured to change a reference voltage value in accordance with a second reference voltage setting code received by terminals associated with the second data signals, to terminate the command/address signals or a pair of data clock signals to a resistance value corresponding to an (Continued)

on-die termination (ODT) code setting stored in a mode register, and to turn off ODT of data signals in the CBT mode.

20 Claims, 16 Drawing Sheets

(51) Int. Cl.
*G11C 8/18* (2006.01)
*G11C 8/10* (2006.01)
*G11C 29/50* (2006.01)
*G11C 29/02* (2006.01)

(52) U.S. Cl.
CPC .......... *G11C 7/1084* (2013.01); *G11C 7/1093* (2013.01); *G11C 8/10* (2013.01); *G11C 8/18* (2013.01); *G11C 29/022* (2013.01); *G11C 29/023* (2013.01); *G11C 29/028* (2013.01); *G11C 29/50012* (2013.01); *G11C 7/1072* (2013.01); *G11C 2207/2254* (2013.01); *G11C 2207/2272* (2013.01)

(58) Field of Classification Search
CPC ..... G11C 8/18; G11C 8/10; G11C 2207/2272; G11C 2207/2254; G11C 29/022; G11C 29/023; G11C 29/028; G11C 29/50012
See application file for complete search history.

(56) References Cited

U.S. PATENT DOCUMENTS

| | | | |
|---|---|---|---|
| 8,432,768 B2 | 4/2013 | Ware | |
| 8,738,852 B2 | 5/2014 | Gupta | |
| 8,972,685 B2 | 3/2015 | Bains | |
| 9,026,725 B2 | 5/2015 | Kostinsky | |
| 9,607,714 B2 | 3/2017 | Malladi | |
| 9,754,650 B2 | 9/2017 | Kim | |
| 9,792,969 B1* | 10/2017 | Kim | G11C 7/10 |
| 2003/0099143 A1* | 5/2003 | Fujioka | G11C 29/40 |
| | | | 365/201 |
| 2007/0005826 A1* | 1/2007 | Yang | G06F 13/1684 |
| | | | 710/24 |
| 2009/0230989 A1* | 9/2009 | Murayama | G06F 13/1668 |
| | | | 326/26 |
| 2012/0042148 A1* | 2/2012 | Grunzke | G11C 5/00 |
| | | | 711/211 |
| 2012/0250433 A1 | 10/2012 | Jeon | |
| 2017/0139612 A1 | 5/2017 | Jeon | |
| 2018/0204610 A1* | 7/2018 | Hsieh | G11C 7/109 |

* cited by examiner

FIG. 5C

| Function | VREFCA Values (% of V$_{DDQ}$) | | | | | | | |
|---|---|---|---|---|---|---|---|---|
| VREFOP[6:0] | 0000000$_B$: | 15.0 | 0100000$_B$: | 31.0 | 1000000$_B$: | 47.0 | 1100000$_B$: | 63.0 |
| | 0000001$_B$: | 15.5 | 0100001$_B$: | 31.5 | 1000001$_B$: | 47.5 | 1100001$_B$: | 63.5 |
| | 0000010$_B$: | 16.0 | 0100010$_B$: | 32.0 | 1000010$_B$: | 48.0 | 1100010$_B$: | 64.0 |
| | 0000011$_B$: | 16.5 | 0100011$_B$: | 32.5 | 1000011$_B$: | 48.5 | 1100011$_B$: | 64.5 |
| | 0000100$_B$: | 17.0 | 0100100$_B$: | 33.0 | 1000100$_B$: | 49.0 | 1100100$_B$: | 65.0 |
| | 0000101$_B$: | 17.5 | 0100101$_B$: | 33.5 | 1000101$_B$: | 49.5 | 1100101$_B$: | 65.5 |
| | 0000110$_B$: | 18.0 | 0100110$_B$: | 34.0 | 1000110$_B$: (default) | 50.0 | 1100110$_B$: | 66.0 |
| | 0000111$_B$: | 18.5 | 0100111$_B$: | 34.5 | 1000111$_B$: | 50.5 | 1100111$_B$: | 66.5 |
| | 0001000$_B$: | 19.0 | 0101000$_B$: | 35.0 | 1001000$_B$: | 51.0 | 1101000$_B$: | 67.0 |
| | 0001001$_B$: | 19.5 | 0101001$_B$: | 35.5 | 1001001$_B$: | 51.5 | 1101001$_B$: | 67.5 |
| | 0001010$_B$: | 20.0 | 0101010$_B$: | 36.0 | 1001010$_B$: | 52.0 | 1101010$_B$: | 68.0 |
| | 0001011$_B$: | 20.5 | 0101011$_B$: | 36.5 | 1001011$_B$: | 52.5 | 1101011$_B$: | 68.5 |
| | 0001100$_B$: | 21.0 | 0101100$_B$: | 37.0 | 1001100$_B$: | 53.0 | 1101100$_B$: | 69.0 |
| | 0001101$_B$: | 21.5 | 0101101$_B$: | 37.5 | 1001101$_B$: | 53.5 | 1101101$_B$: | 69.5 |
| | 0001110$_B$: | 22.0 | 0101110$_B$: | 38.0 | 1001110$_B$: | 54.0 | 1101110$_B$: | 70.0 |
| | 0001111$_B$: | 22.5 | 0101111$_B$: | 38.5 | 1001111$_B$: | 54.5 | 1101111$_B$: | 70.5 |
| | 0010000$_B$: | 23.0 | 0110000$_B$: | 39.0 | 1010000$_B$: | 55.0 | 1110000$_B$: | 71.0 |
| | 0010001$_B$: | 23.5 | 0110001$_B$: | 39.5 | 1010001$_B$: | 55.5 | 1110001$_B$: | 71.5 |
| | 0010010$_B$: | 24.0 | 0110010$_B$: | 40.0 | 1010010$_B$: | 56.0 | 1110010$_B$: | 72.0 |
| | 0010011$_B$: | 24.5 | 0110011$_B$: | 40.5 | 1010011$_B$: | 56.6 | 1110011$_B$: | 72.5 |
| | 0010100$_B$: | 25.0 | 0110100$_B$: | 41.0 | 1010100$_B$: | 57.0 | 1110100$_B$: | 73.0 |
| | 0010101$_B$: | 25.5 | 0110101$_B$: | 41.5 | 1010101$_B$: | 57.5 | 1110101$_B$: | 73.5 |
| | 0010110$_B$: | 26.0 | 0110110$_B$: | 42.0 | 1010110$_B$: | 58.0 | 1110110$_B$: | 74.0 |
| | 0010111$_B$: | 26.5 | 0110111$_B$: | 42.5 | 1010111$_B$: | 58.5 | 1110111$_B$: | 74.5 |
| | 0011000$_B$: | 27.0 | 0111000$_B$: | 43.0 | 1011000$_B$: | 59.0 | 1111000$_B$: | 75.0 |
| | 0011001$_B$: | 27.5 | 0111001$_B$: | 43.5 | 1011001$_B$: | 59.5 | 1111001$_B$: | 75.5 |
| | 0011010$_B$: | 28.0 | 0111010$_B$: | 44.0 | 1011010$_B$: | 60.0 | 1111010$_B$: | RFU |
| | 0011011$_B$: | 28.5 | 0111011$_B$: | 44.5 | 1011011$_B$: | 60.5 | 1111011$_B$: | RFU |
| | 0011100$_B$: | 29.0 | 0111100$_B$: | 45.0 | 1011100$_B$: | 61.0 | 1111100$_B$: | RFU |
| | 0011101$_B$: | 29.5 | 0111101$_B$: | 45.5 | 1011101$_B$: | 61.5 | 1111101$_B$: | RFU |
| | 0011110$_B$: | 30.0 | 0111110$_B$: | 46.0 | 1011110$_B$: | 62.0 | 1111110$_B$: | RFU |
| | 0011111$_B$: | 30.5 | 0111111$_B$: | 46.5 | 1011111$_B$: | 62.5 | 1111111$_B$: | RFU |

FIG. 7B

Mode Register (320)

| Function | Register Type | Operand | Data |
|---|---|---|---|
| FSP-OP (Frequency Set Point Operation Mode) | Write/Read | OP[3:2] | 00B: Frequency-Set-Point[0] (default)<br>01B: Frequency-Set-Point[1]<br>10B: Frequency-Set-Point[2]<br>11B: Reserved |
| CBT (Command Bus Training) | | OP[5:4] | 00B: Normal Operation (default)<br>01B: Command Bus Training Mode Enabled FSP0<br>10B: Command Bus Training Mode Enabled FSP1<br>11B: Command Bus Training Mode Enabled FSP2 |

Mode Register (320)

| Function | OP | DATA |
|---|---|---|
| CA_ODT | OP[6:4] | $000_B$ : Disable |
| | | $001_B$ : RZQ/1 |
| | | $010_B$ : RZQ/2 |
| | | $011_B$ : RZQ/3 |
| | | $100_B$ : RZQ/4 |
| | | $101_B$ : RZQ/5 |
| | | $110_B$ : RZQ/6 |
| | | $111_B$ : RFU |

Mode Register (320)

| Function | OP | DATA |
|---|---|---|
| DQ_ODT | OP[2:0] | $000_B$ : Disable |
| | | $001_B$ : RZQ/1 |
| | | $010_B$ : RZQ/2 |
| | | $011_B$ : RZQ/3 |
| | | $100_B$ : RZQ/4 |
| | | $101_B$ : RZQ/5 |
| | | $110_B$ : RZQ/6 |
| | | $111_B$ : RFU |

FIG. 9B

Mode Register (320)

| Function | OP | DATA |
|---|---|---|
| WCK_ODT | OP[2:0] | $000_B$ : Disable |
| | | $001_B$ : RZQ/1 |
| | | $010_B$ : RZQ/2 |
| | | $011_B$ : RZQ/3 |
| | | $100_B$ : RZQ/4 |
| | | $101_B$ : RZQ/5 |
| | | $110_B$ : RZQ/6 |
| | | $111_B$ : RFU |

US 10,720,197 B2

MEMORY DEVICE FOR SUPPORTING COMMAND BUS TRAINING MODE AND METHOD OF OPERATING THE SAME

CROSS-REFERENCE TO RELATED APPLICATIONS

This application claims the benefit of U.S. Provisional Application No. 62/734,347, flied on Sep. 21, 2018, in the U.S. Patent Office and Korean Patent Application Nos. 10-2017-0155812 and 10-2018-0111604, respectively filed on Nov. 21, 2017 and Sep. 18, 2018, in the Korean intellectual Property Office, the disclosures of which are incorporated herein in their entireties by reference.

BACKGROUND

The inventive concept relates to a semiconductor memory device, and, more particularly, to a memory device for supporting a command bus training (CBT) mode and a method of operating the same.

A mobile-oriented memory device, such as a low power double data rate (LPDDR) synchronous dynamic random access memory (SDRAM), is typically used in mobile electronic devices, such as a smart phone, a tablet PC, and/or an ultra-book. As the capacity of a mobile operating system (OS) increases to support multitasking operations performed by a mobile electronic device, it may be desirable to provide mobile electronic devices having a low power consuming characteristic and high speed operating performance.

To increase the high speed operating performance of a memory device, a high speed clock signal may be provided to an interface between the memory device and a memory controller (or a central processing unit (CPU)). The memory device may process signals received from the memory controller in response to a clock signal received from the memory controller and may synchronize signals transmitted to the memory controller with the clock signal. To support a high data transmitting speed, a frequency of the clock signal provided from the memory controller may increase. Therefore, it may be important for the memory device to correctly receive a transmitted signal. Therefore, the memory device may adopt a bus training technique.

SUMMARY

The inventive concept provides a memory device for supporting a command bus training (CBT) mode and a method of operating the same.

According to an aspect of the inventive concept, there is provided memory device for supporting a CBT mode. The memory device includes a data clock signal, command/address signals including a CBT pattern, data signals including a first data signal and second data signals, the second data signals being in one-to-one correspondence with the command/address signals, from which the CBT pattern is output, in the CBT mode, and a control logic configured to initiate entry into the CBT mode in response to a first logic level of the first data signal synchronized with the data clock signal and further configured to exit from the CBT mode in response to a second logic level opposite to the first logic level of the first data signal.

According to an aspect of the inventive concept, there is provided a method of operating a memory device for supporting a CBT mode. The method includes receiving a data clock signal, entering the CBT mode in response to a first logic level of a first data signal synchronized with the data clock signal, receiving a CBT pattern formed of a bit configuration of command/address signals in the CBT mode, outputting the CBT pattern through terminals associated with second data signals, which are in one-to-one correspondence with the command/address signals in the CBT mode, and exiting from the CBT mode in response to a second logic level opposite to the first logic level of the first data signal synchronized with the data clock signal. The second data signals do not include the first data signal in the CBT mode.

According to an aspect of the inventive concept, there is provided a memory system including a memory device configured to enter a command bus training (CBT) mode or exit from the CBT mode in response to a logic level of a first data signal and a memory controller configured to transmit a CBT pattern to the memory device through terminals associated with command/address signals. The second data signals for outputting the CBT pattern in the CBT mode are in one-to-one correspondence with the command/address signals and to not include the first data signal in the CBT mode. The memory device is thither configured to change a reference voltage value in accordance with a second reference voltage setting code received to terminals associated with the second data signals, to terminate the command/address signals or a pair of data clock signals to a resistance value corresponding to an ODT code setting stored in a mode register, and to turn off ODT of the data signals in the CBT mode.

BRIEF DESCRIPTION OF THE DRAWINGS

Embodiments of the inventive concept will be more clearly understood from the following detailed description taken in conjunction with the accompanying drawings in which:

FIGS. 5A to 5C are views illustrating a reference voltage setting circuit of FIG. 2 according to an example embodiment of the inventive concept;

FIGS. 7A to 7D are views illustrating a command/address CA on-die termination (ODT) control circuit according to an example embodiment of the inventive concept;

FIGS. 9A to 9C are views illustrating a WCK ODT control circuit of FIG. 2 according to an example embodiment of the inventive concept.

DETAILED DESCRIPTION THE EMBODIMENTS

Hereinafter, example embodiments of the present disclosure will be described in detail with reference to the accompanying drawings. As memory devices are operated at increasingly higher frequencies, the risk of errors in transmission between a memory controller and the memory may increase. Command Bus Training (CBT) may be performed to determine whether a command/address (CA) signal transmitted through a CA bus is correctly received by a memory device. Some embodiments of the inventive concept stem from a realization that a memory device may be configured to enter a CBT mode or exit from the CBT mode in response to a logic level of a first data signal, which is not part of a collection of second data signals used to output a CBT pattern in the CBT mode in one-to-one correspondence with CA signals. Moreover, the memory device may change a reference voltage value in accordance with a reference voltage setting code received by terminals associated with the second data signals. The CA signals may be terminated to a resistance value corresponding to an on-die termination (ODT) code setting stored in a mode register. ODT may be turned off for data signals in the CBT mode. As used herein, the term "and/or" includes any and all combinations of one or more of the associated listed items.

Figure 1:
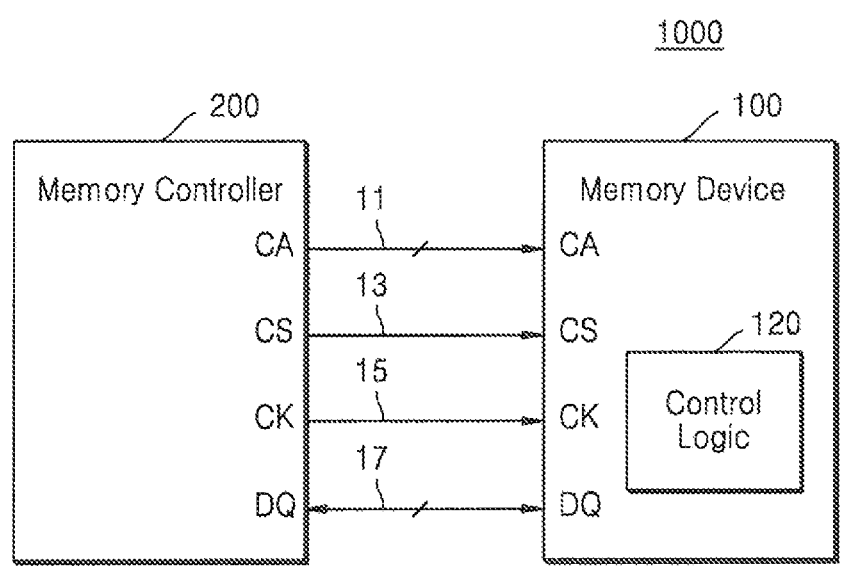
FIG. 1 is a block diagram illustrating a memory system according to an example embodiment of the inventive concept.

FIG. 1 is a block diagram illustrating a memory system 1000 according to an example embodiment of the inventive concept.

Referring to FIG. 1, the memory system 1000 includes a memory device 100 and a memory controller 200. The memory system 1000 may be configured so as to be included in a personal computer (PC) or a mobile electronic device. The mobile electronic device may be a variety of different types of devices including, but not limited to, a laptop computer, a mobile telephone, a smart phone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, a mobile Internet device (MID), a wearable computer, an internet of things (IoT) device, an internet of everything (IoE) device, and/or a drone.

The memory device 100 may include a memory cell array including a plurality of memory cells. In an embodiment, a memory cell may be a volatile memory cell and the memory device 100 may be dynamic random access memory (DRAM), static random access memory (SRAM), mobile DRAM, double data rate synchronous dynamic random access memory (DDR SDRAM), low power DDR (LPDDR) SDRAM, graphics DDR (DDDR) SDRAM, and/or Rambus dynamic random access memory (RDRAM) as a non-restrictive example. In another embodiment, a memory cell may be a non-volatile memory cell and the memory device 100 may be a non-volatile memory, such as electrically erasable programmable read-only memory (EEPROM), a flash, memory, phase change random access memory (PRAM), resistance random access memory (RRAM), nano floating gate memory (NFGM), polymer random access memory (PoRAM), magnetic random access memory (MRAM), and/or ferroelectric random access memory (FRAM). Hereafter, for purposes of illustration, the memory device 100 is illustrated as being a DRAM. However, embodiments of the inventive concept are not limited thereto.

The memory controller 200 may comprise a variety of different types of components including, but not limited to, an application processor (AP), a mobile AP, a chipset, and/or a set of chips. The memory controller 200 may include no less than one processor including a single core processor and/or a multicore processor. According to an embodiment, the memory controller 200 may be configured as a physical device separate from a package including processors and cache components. According to an embodiment, the memory controller 200 may comprise a portion of the processor, for example, a circuit of the processor. According to an embodiment, the memory controller 200 may be configured as logic on a system on chip (SOC) shared by a plurality of processor devices.

Signal lines between the memory controller 200 and the memory device 100 may be connected through connectors. The connectors may comprise pins, balls, signal lines, and/or other hardware components. A command/address CA signal may be transmitted from the memory controller 200 to the memory device 100 through a command/address bus 11. A chip selection CS signal may be transmitted from the memory controller 200 to the memory device 100 through a chip selection line 13. The chip selection CS signal when activated to logic high level may represent that the command/address CA signal transmitted through the command/address bus 11 is a command. Data DQ is transmitted from the memory controller 200 to the memory device 100 or may be transmitted from the memory device 100 to the memory controller 200 through a data bus 17 formed of bidirectional signal lines.

As the data storage capacity of the memory device 100 increases and operation speeds of devices that access the memory device 100, for example, a central processing unit (CPU), a graphics processing unit (CPU), and an intellectual property (IP) core increase, the memory device 100 may support a high speed interface. The memory device 100 may receive a clock CK signal from the memory controller 200 through a clock line 15 and may receive signals from the memory controller 200, for example, the command/address CA signal and the data DQ based on the received clock CK signal. In addition, the memory device 100 may transmit the data DQ synchronized with the received clock CK signal to the memory controller 200 so that the memory controller 200 may receive the data DQ.

In FIG. 1, an example in which the clock CK signal is transmitted through the clock line 15 is illustrated. However, the clock CK signal may be differentially transmitted through two signal lines. Hereinafter, the memory device 100 is illustrated as operating in synchronization with a rising edge of the clock CK signal. However, according to example embodiments of the inventive concept, the memory device 100 may operate in synchronization with a falling edge of the clock CK signal.

To receive the command/address CA signal and the data DQ based on the clock CK signal having a high frequency, the memory device 100 and the memory controller 200 may support a bus training mode. That is, when power is supplied to the memory system 1000 or a certain condition is satisfied, the memory controller 200 may perform bus training on the command bus 11 and/or the data bus 17. For example, the memory controller 200 may transmit a command that initiates entry into the bus training mode together with the clock CK signal of a low frequency to the memory device 100 through the command bus 11 and the memory device 100 may enter the bus training mode in response thereto. In the bus training mode, the memory controller 200 may transmit a certain signal to the memory device 100 through a signal line to be trained together with a clock CK signal of a high frequency and may receive a response from the memory device 100. The memory controller 200 may determine timing, for example, delay of a signal transmitted through the signal line to be trained based on the response received from the memory device 100.

Data bus training may be performed by determining whether the data DQ transmitted through the data bus 17 at a rising or falling edge of a data clock WCK signal is correctly received by the memory device 100 over time after the memory controller 200 transmits a certain command through the command bus 11.

On the other hand, command bus training (CBT) may be performed before the data bus training is performed. The CBT may be performed by determining whether the command/address CA signal transmitted through the command bus 11 at a rising or falling edge of the clock CK signal is correctly received by the memory device 100. In addition, because the chip selection CS signal (the points in time Ta0 and Ta1 of FIG. 3) representing that the command/address CA signal is a command may have an active pulse width of no more than a period of the clock CK signal during a common operation, the CBT may include a process (the point in time Te1 of FIG. 3) of using the activated chip selection CS signal.

As described above, while the data bus training checks whether the data DQ is correctly received at a certain rising or falling edge of the clock CK signal, the CBT may be performed before the data bus training and may check whether the command/address CA signal is correctly received at a rising edge at which the clock CK signal is not specified. Therefore, the CBT may be more difficult than the data bus training. During the CBT, to correctly receive the command/address CA signal, the memory device 100 may include a control logic 120 for controlling a CBT mode.

The control logic 120 may enter and exit from the CBT mode by using a logic level of a data signal (for example, DQ[7] of FIG. 3) from which a CBT pattern is not output among data DQ signals. The control logic 120 performs control so that the CBT pattern is received through terminals of command/address CA signals and may perform control so that the CBT pattern is output through terminals of data signals (for example, DQ[6:0] of FIG. 3) from which the CBT pattern is output among the data DQ signals.

Figure 2:
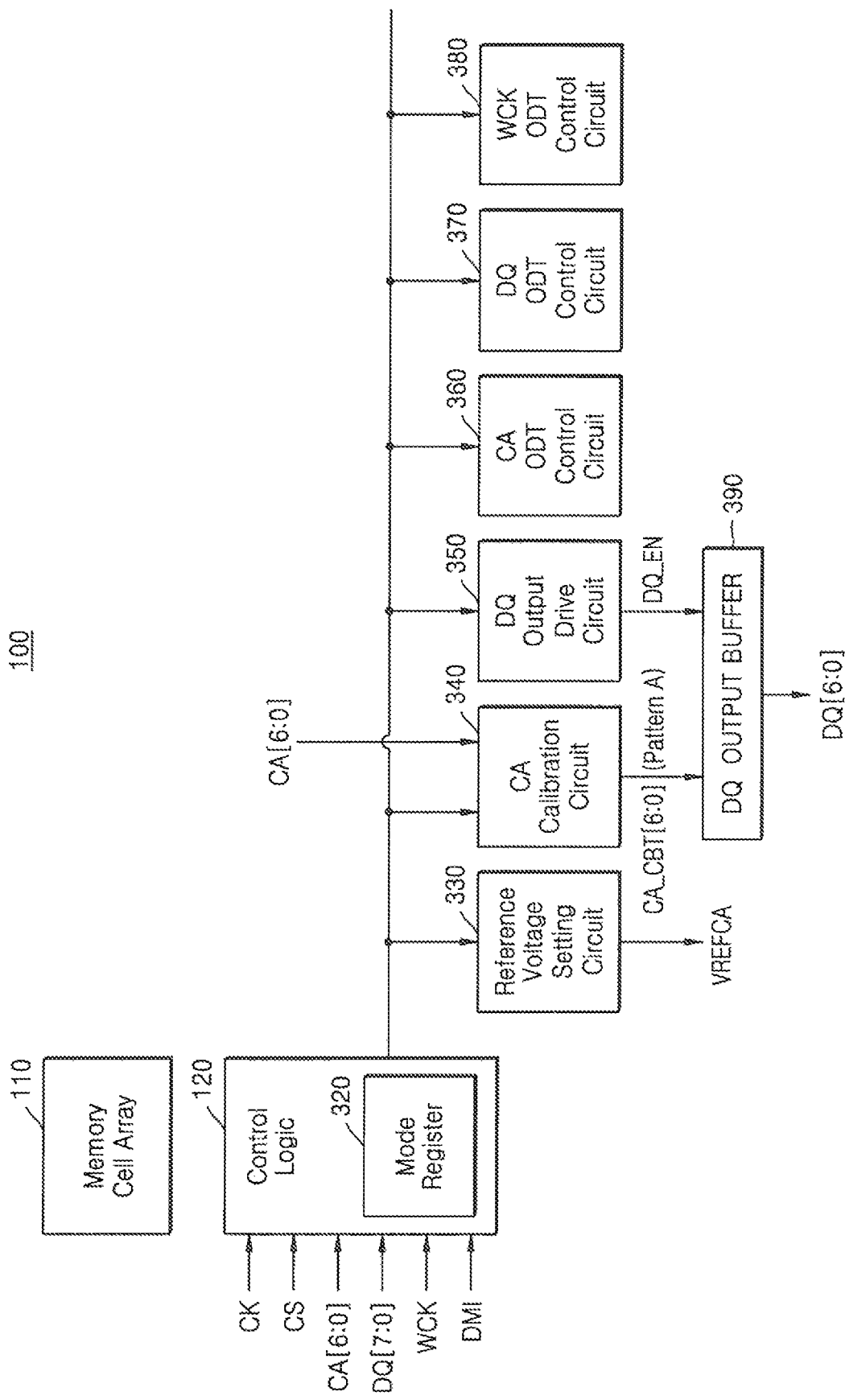
FIG. 2 is a block diagram illustrating a memory device of FIG. 1.

FIG. 2 is a block diagram illustrating the memory device 100 FIG. 1 according to example embodiments of the inventive concept.

Referring to FIG. 2, the memory device 100 may include a memory cell array 110, the control logic 120, a reference voltage setting circuit 330, a CA calibration circuit 340, a DQ output drive circuit 350, a CA ODT control circuit 360, a DQ ODT control circuit 370, and a WCK ODT control circuit 380.

The memory cell array 110 includes a plurality of memory cells provided in rows and columns in a matrix. The memory cell array 110 includes a plurality of word lines WL and a plurality of bit lines BL connected to the memory cells. The plurality of word lines WL are connected to the rows of the memory cells and the plurality of bit lines BL may be connected to the columns of the memory cells.

The control logic 120 may generate a CBT enable signal CBT_EN in response to the clock CK signal, the chip selection CS signal, the command/address CA signal, the data clock WCK signal, and/or the data DQ and/or a data mask inversion (DMI) signal. The CBT enable signal CTB_EN is used as a driving signal for initiating the CBT mode and may be provided to the reference voltage setting circuit 330, the CA calibration circuit 340, the DQ output drive circuit 350, the CA ODT control circuit 360, the DQ ODT control circuit 370, and/or the WCK ODT control circuit 380.

A mode register 320 may program functions, characteristics, and/or modes of the memory device 100. The mode register 320 may be programmed by an MRS command in accordance with the command/address CA signal transmitted through the command/address bus 11 and may be programmed according to user defined variables. The mode register 320 may be divided into various fields in accordance with the functions, the characteristics, and/or the modes. Because all the registers of the mode register 320 have defined default values, contents of the mode register 320 may be initialized. That is, after reset for power-up and/or a write operation, the contents of the mode register 320 may be programmed. In addition, the contents of the mode register 320 may change by re-executing the MRS command during a normal operation. Therefore, the functions, the characteristics, and/or the modes of the memory device 100 may be updated.

The mode register 320 may be configured to store a first reference voltage setting code MR[6:0] provided to the reference voltage setting circuit 330, set an FSP operation mode FSP-OP and a CBT operation mode CBT_OP that are provided to the CA OPT control circuit 360, store a CA ODT code CA_ODT[6:4], store a DQ OPT code DQ_ODT[2:0] provided to the DQ ODT control circuit 370, and store a WCK OPT code WCK_ODT[2:0] provided to the WCK OPT control circuit 380.

The reference voltage setting circuit 330 may change a reference voltage VREFCA value in the CBT mode in response to the CBT enable signal CBT_EN in accordance with a reference voltage code VREFOP[6:0] corresponding to a second reference voltage setting code CBT_DQ[6:0] received by DQ[6:0] data terminals.

The CA calibration circuit 340 may output CA_CBT[6:0] bits of a pattern A received by command/address signal CA[6:0] terminals in response to the CBT enable signal CBT_EN in the CBT mode.

The DQ output drive circuit 350 may enable the data output buffer 390 for outputting the pattern A of CA_CBT [6:0] bits configuration provided from the CA-calibration circuit 340 to DQ[6:0] data terminals in response to the CBT enable signal CBT_EN in the CBT mode.

The memory device 100 may provide an OPT for turning on/off termination resistance against the command/address CA signal, the data clock WCK signal, and the data DQ. For the OPT to improve signal fidelity, the memory controller 200 may be allowed to turn on or off the termination resistance through mode register setting of the memory device 100.

The CA OPT control circuit 360 may perform control so that ideal termination is provided to the command/address CA signal based on estimated impedance matching. The CA OPT control circuit 360 may terminate the command/address CA signal by a resistance value corresponding to a CA OPT code CA_ODT[6:4] setting stored in the mode register 320 in the CBT mode in response to the CBT enable signal CBT_EN.

The DQ ODT control circuit 370 may perform control so that ideal termination is provided to the data DQ based on estimated impedance matching. The DQ OPT control circuit 370 terminates the data DQ by a resistance value corresponding to a DQ OPT code DQ_ODT[2:0] setting stored in the mode register 320 in a normal mode and may turn off DQ OPT in the CBT mode.

The WCK OPT control circuit 380 may perform control so that ideal termination is provided to a pair of data clock WCK and WCKB signals based on estimated impedance matching. The WCK ODT control circuit 380 may terminate the pair of data clock WCK and WCKB signals by a resistance value corresponding to a WCK ODT code WCK_ODT[2:0] setting stored in the mode register 320 in the CBT mode in response to the CBT enable signal CBT_EN.

The reference voltage setting circuit 330, the CA calibration circuit 340, the DQ output drive circuit 350, the CA ODT control circuit 360, the DQ ODT control circuit 370, the WCK ODT control circuit 380, and the DQ output buffer 390 may provide additional control logic functionality in conjunction with the control logic 120. All or some of these modules may be collectively referred to as "control logic" that is configured to carry out one or more operations and/or provide various functionality described herein.

Figure 3:
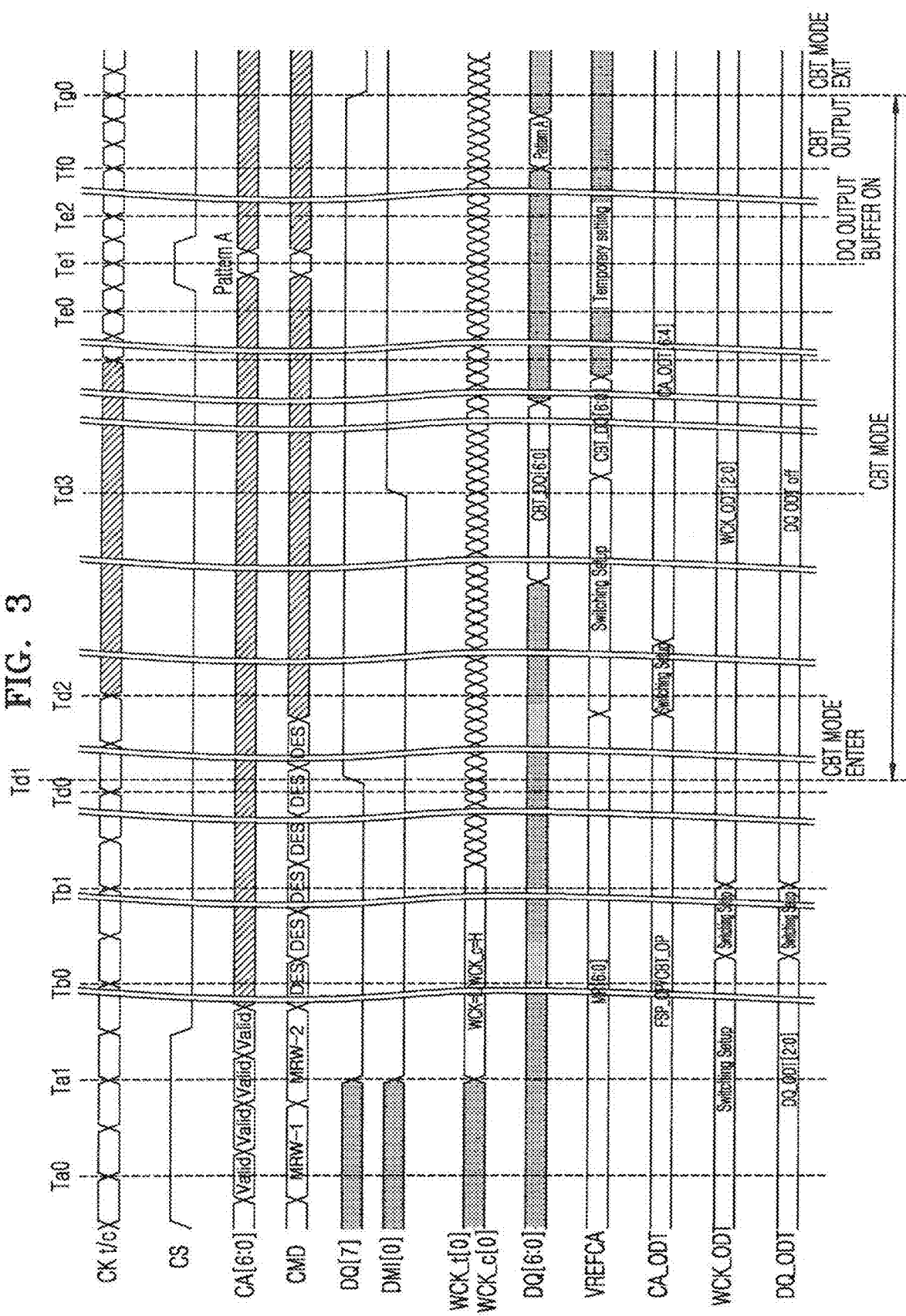
FIG. 3 is a timing diagram illustrating a command bus training (CBT) operation of the memory device of FIG. 2 according to an example embodiment of the inventive concept.

FIG. 3 is a timing diagram illustrating a CBT operation of the memory device 100 of FIG. 2 according to example embodiments of the inventive concept. FIG. 3 is an example timing diagram of signals that move between the memory device 100 and the memory controller 200 during the CBT.

Referring to FIG. 3, the clock CK signal is received from a point in time Ta0. At the point in time Ta0, it may be represented that the activated chip selection CS signal and a command/address signal CA[6:0] transmitted through the command/address bus 11 are a mode register setting command MRW-1. At a point in time Ta1, it may be represented that the activated chip selection CS signal and the command/address signal CA[6:0] transmitted through the command/address bus 11 are a mode register setting command MRW-2. At the points in time Ta0 and Ta1, the mode register setting commands MRW-1 and MRW-2 synchronized at the rising edge of the clock CK signal are received by the memory device 100 and the memory device 100 may set the CBT mode in the mode register 320.

At a point in time Td1, in response to transition of data DQ[7] synchronized at a rising edge of the data clock WCK signal to a logic high value, the memory device 100 may enter the CBT mode. The data clock WCK signal may have a clock frequency similar to that of a clock signal generated by dividing the clock CK signal into, for example, four. The data DQ[7] refers to a data signal excluded from a one-to-one matching relationship with the command/address CA signal CA[6:0] in the data DQ[7:0] in the CBT mode. In the CBT mode, the command/address signal CA[6:0] corresponding to data DQ[6:0] is output as the CBT signal. However, the data DQ[7] is not used for being output as the CBT signal. The data DQ[7] that is not used for outputting the CBT signal may be used as a signal for initiating entry into the CBT mode.

At the point in time Td1, when the CBT enable signal CBT_EN is activated by the control logic 120, the reference voltage setting circuit 330 changes the reference voltage VREFCA value in accordance with the second reference voltage setting code CBT_DQ[6:0], the CA ODT control circuit 360 terminates the command/address CA signal by a resistance value corresponding to CA ODT code CA_ODT[6:4] setting, the DQ ODT control circuit 370 is disabled to turn off DQ ODT, and the WCK ODT control circuit 380 may terminate the pair of data clock WCK and WCKB signals by a resistance value corresponding to the WCK ODT code WCK_ODT[2:0] setting.

At a point in time Td2, a frequency set-point (FSP) may be switched in response to a logic high value of the data DQ[7]. From the point in time Ta0 to the point in time Td2, the reference voltage setting circuit 330 may change the reference voltage VREFCA in accordance with the first reference voltage setting code MR[6:0] stored in the mode register 320. The FSP may enable operation settings, such as the reference voltage VREFCA setting and/or a reference voltage VREFCA range. The memory device 100 may set an FSP operation mode (FSP-OP) in the mode register 320. When the memory device 100 is powered-up, the FSP-OP is set as default "0". A default setting value FSP-OP[0] may be provided for a low frequency operation that is not terminated. Switching to FSP-OP[1] may change the FSP-OP in the CBT mode.

At a point in time Td3, in response to the logic high value of the data DQ[7] and transition of the DMI signal to a logic high value, the memory device 100 may set a reference voltage VREFCA level. The reference voltage VREFCA level may be determined based on a bit combination of the data signals DQ[6:0] received by the memory device 100. The reference voltage setting circuit 330 may output the second reference voltage setting code CBT_DQ[6:0] received by the data DQ[6:0] terminal as the reference voltage code VREFOP[6:0] and may change the reference voltage VREFCA value in accordance with the reference voltage code VREFOP[6:0].

At the point in time Te1, the command/address signals CA[6:0] having "a pattern A" may be received in an intermediate position of a logic high pulse of the chip selection CS signal. In response to a data buffer enable signal DQ_EN output from the DQ output drive circuit 350, the data output buffer 390 connected to data DQ[6:0] terminals respectively corresponding to the command/address signals CA[6:0] of "the pattern A" may be turned on.

At a point in time Tf0, "the pattern A" may be output as a CBT output signal through the data DQ[6:0] terminals of the memory device 100.

At a point in time Tg0, in response to transition of the data DQ[7] synchronized at the rising edge of the clock OK signal to logic low, the memory device 100 may exit from the CBT mode.

Figure 4:
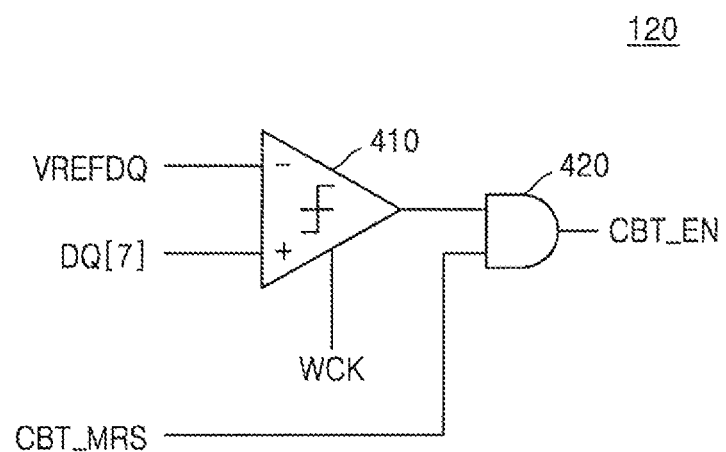
FIG. 4 is a circuit diagram illustrating a portion of a control logic of FIG. 2 according to an example embodiment of the inventive concept.

FIG. 4 is a circuit diagram illustrating a portion of the control logic 120 of FIG. 2 according to example embodiments of the inventive concept.

Referring to FIG. 4, the control logic 120 may include a comparator 410 and an AND logic gate 420. The comparator 410 may compare the reference voltage VREFDQ to the data DQ[7] in response to the data clock WCK signal. The comparator 410 outputs a logic high value when a voltage level of the data DQ[7] is higher than the reference voltage VREFDQ level and may output logic low when the voltage level of the data DQ[7] is lower than the reference voltage VREFDQ level. The AND logic gate 420 may receive the output of the comparator 410 and a first CBT mode signal CBT_MRS provided by the mode register 320 and may output the CBT enable signal CBT_EN. When the output of the comparator 410 is a logic high value and the first CBT mode signal CBT_MRS is a logic high value, the AND logic gate 420 may output the CBT enable signal CBT_EN at a logic high value.

For example, the control logic 120 may generate the CBT enable signal CBT_EN a logic high value at the point of time Td1. The CBT enable signal CBT_EN at a logic high value may operate as a driving signal in the CBT mode.

Figure 5A:
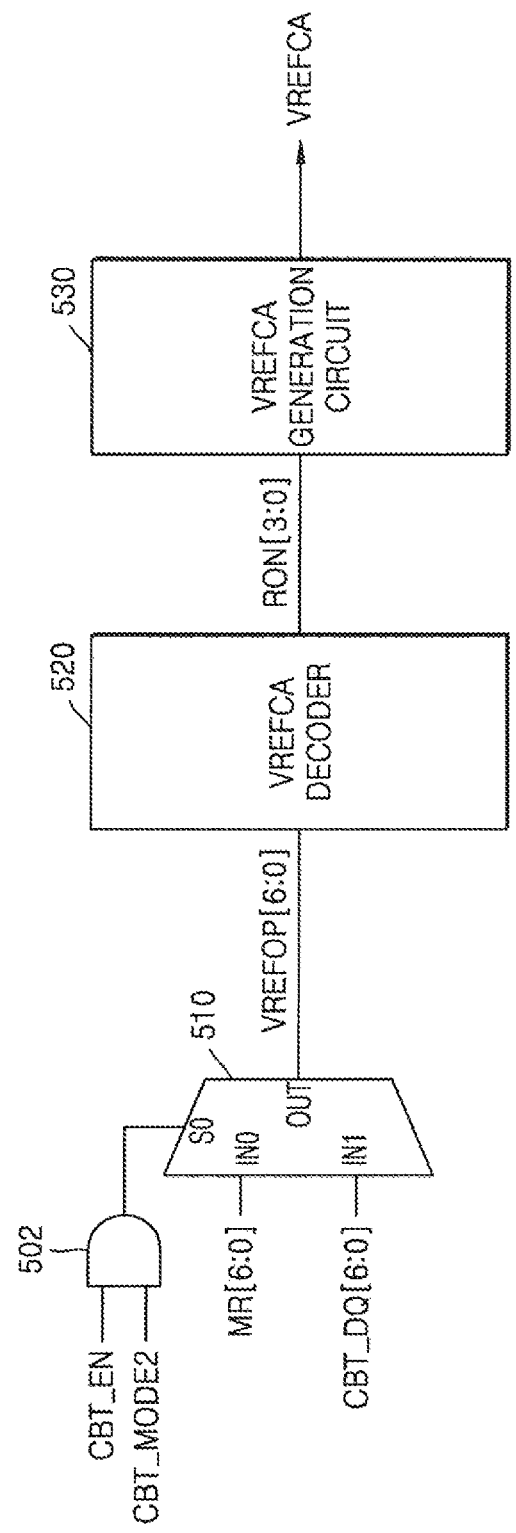
Figure 5B:
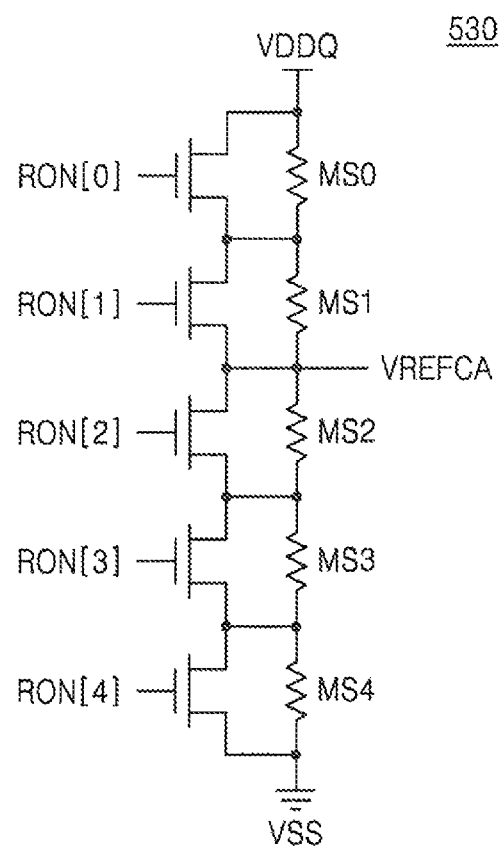

FIGS. 5A to 5C are views illustrating the reference voltage setting circuit 330 of FIG. 2 according to example embodiments of the inventive concept.

Referring to FIG. 5A, the reference voltage setting circuit 330 may include an AND logic gate 502, a selecting unit 510, a reference voltage decoder 520, and a reference voltage generation circuit 530.

The CBT enable signal CBT_EN and a second CBT mode signal CBT_MODE2 may be input to the AND logic gate 502. The second CBT mode signal CBT_MODE2 may be used as a control signal so that a reference voltage setting operation is performed by using a data mask inversion signal DMI[0]. When the data mask inversion signal DMI[0] is a logic high value, the second CBT mode signal CBT_MODE2 may be provided as a logic high value. For example, at the point in time Td3 of FIG. 3, in a period in which the data mask inversion signal DM[0] is a logic high value, the second CBT mode signal CBT_MODE2 may be provided as a logic high value. When the CBT enable signal CBT_EN and the second CBT mode signal CBT_MODE2 are logic high values, that is, at a point in time Td3, the AND logic gate 502 may provide an output signal of a logic high value as a selection signal S0 of the selecting unit 510.

The selecting unit 510 may output one of the signals input to a first input terminal IN0 and a second input terminal IN1 to an output terminal OUT in response to the selection signal S0. A first reference voltage setting code MR[6:0] stored in the mode register 320 may be input to the first input terminal IN0 and a second reference voltage setting code CBT_DQ [6:0] received as the data DO[6:0] may be input to the second input terminal IN1.

When the selection signal S0 is a logic low value, the selecting unit 510 may output the first reference voltage setting code MR[6:0] input to the first input terminal IN0 as the reference voltage code VREFOP[6:0]. For example, from the point in time Ta0 to the point in time Td2 of FIG. 3, the first reference voltage setting code MR[6:0] stored in the mode register 320 may be output as the reference voltage code VREFOP[6:0].

When the selection signal S0 is a logic high value, the selecting unit 510 may output the second reference voltage setting code CBT_DQ[6:0] input to the second input terminal IN1 as the reference voltage code VREFOP[6:0]. For example, the second reference voltage setting code CBT_DQ[6:0] received as the data DQ[6:0] at the point in time Td3 of FIG. 3 may be output as the reference voltage code VREFOP[6:0].

The reference voltage code VREFOP[6:0] output from the selecting unit 510 may be provided to the reference voltage decoder 520. The reference voltage decoder 520 may output a resistance switching signal code RON[3:0] corresponding to the reference voltage code VREFOP[6:0] and may provide the resistance switching signal code RON[3:0] to the reference voltage generation circuit 530.

In FIG. 5B, the reference voltage generation circuit 530 may include a plurality of resistors RS0 to RS4 serially connected between a power voltage VDDQ and a ground voltage VSS and transistors MS0 to MS4 connected among the plurality of resistors RS0 to RS4. A voltage corresponding to the resistance switching signal code RON[3:0] provided from the reference voltage decoder 520 as bit information may be applied to gates of the transistors MS0 to MS4. The reference voltage generation circuit 530 may output the reference voltage VREFCA distributed by the resistors RS0 to RS4 shorted in accordance with the resistance switching signal code RON[3:0] at the power voltage VDDQ.

FIG. 5C is a reference voltage setting table illustrating a correlation between the reference voltage code VREFOP[6:0] and the reference voltage VREFCA value as an operation result of the reference voltage setting circuit 330. In the reference voltage setting table, an example, in which the reference voltage VREFCA value is about 15% of the power voltage VDDQ when the reference voltage code VREFOP [6:0] is 0000000, the reference voltage VREFCA value increases as the reference voltage code VREFOP[6:0] increases, and the reference voltage VREFCA value is about 75% of the power voltage VDDQ when the reference voltage code VREFOP[6:0] is 1111000, is illustrated. That is, the reference voltage VREFCA value may be variably set in accordance with the reference voltage code VREFOP[6:0].

For example, the above-described reference voltage setting circuit 330 may change the reference voltage VREFCA value in accordance with the reference voltage code VREFOP[6:0] corresponding to the second reference voltage setting code CBT_DQ[6:0], after entering the CBT mode at the point in time Td1 of FIG. 3.

Figure 6:
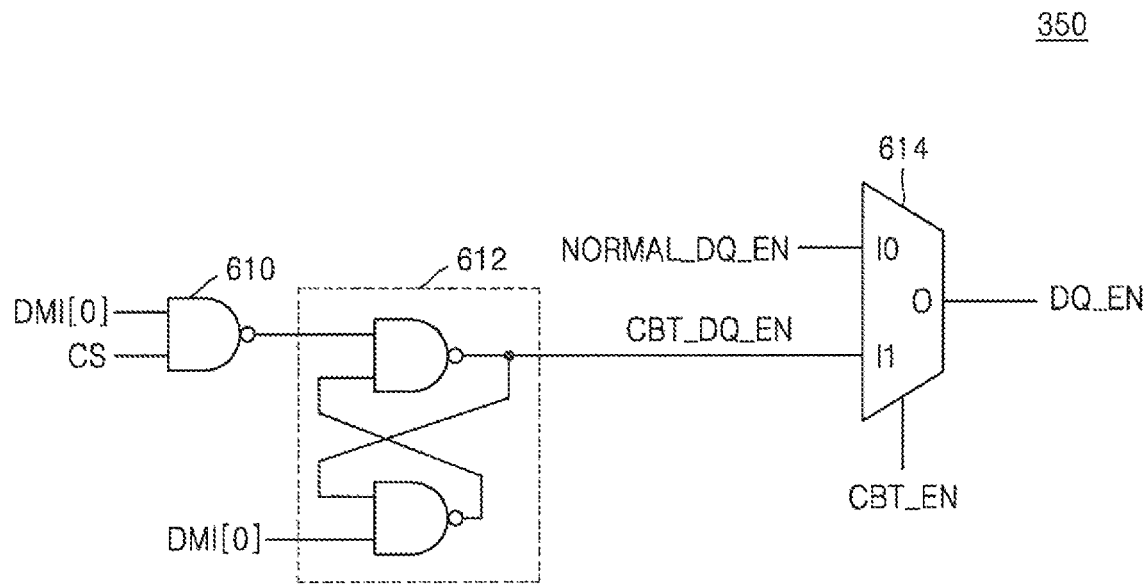
FIG. 6 is a circuit diagram illustrating a DQ output drive circuit of FIG. 2 according to an example embodiment of the inventive concept.

FIG. 6 is a circuit diagram illustrating the DQ output drive circuit 350 of FIG. 2 according to example embodiments of the inventive concept.

Referring to FIG. 6, the DQ output drive circuit 350 includes a NAND logic gate 610, a latch circuit 612, and a selecting unit 614.

The NAND logic gate 610 receives as an input the data mask inversion signal DMI[0] and the chip selection CS signal and may provide an output to the latch circuit 612. The latch circuit 612 may output a CBT output enable signal CBT_DQ_EN responsive to the output of the NAND logic gate 610 and the data mask inversion signal DMI[0]. For example, an operation of turning on the data output buffer 390 at the point in time Te1 of FIG. 3 may be performed.

A first input terminal I0 of the selecting unit 614 may receive a normal output enable signal NORMAL_PQ_EN and a second input terminal I1 may receive the CBT output enable signal CBT_Q_EN. The selecting unit 614 selects the normal output enable signal NORMAL_DQ_EN of the first input terminal I0 or the CBT output enable signal CBT_DQ_EN of the second input terminal I1 in response to the CBT enable signal CBT_EN and may output the selected signal as the data buffer enable signal DQ_EN.

The selecting unit 614 may output the normal output enable signal NORMAL_DQ_EN as the data buffer enable signal DQ_EN in response to a logic low value of the CBT enable signal CBT_EN in a normal mode. In the normal mode, a writing operation or a reading operation of the memory device 100 is performed.

The selecting unit 614 may output the CBT output enable signal CBT_DQ_EN as the data buffer enable signal DQ_EN in response to a logic high value of the CBT enable signal CBT_EN in the CBT mode. For example, an operation of turning on the data output buffer 390 at the point in time Te1 of FIG. 3 may be performed.

The data buffer enable signal DQ_EN output in accordance with the CBT output enable signal CBT_DQ_EN may be provided to the data output buffer 390. The data output buffer 390 may output the pattern A of the bit CA_CBT[6:0] configuration provided by the CA calibration circuit 340 to the data DQ[6:0] terminals. For example, at the point in time Tf0 of FIG. 3, the pattern A of the bit CA_CBT[6:0] configuration may be output as the CBT output signal through the data DQ[6:0] of the memory device 100.

FIGS. 7A to 7D are views illustrating the CA ODT control circuit 360 according to example embodiments of the inventive concept.

Figure 7A:
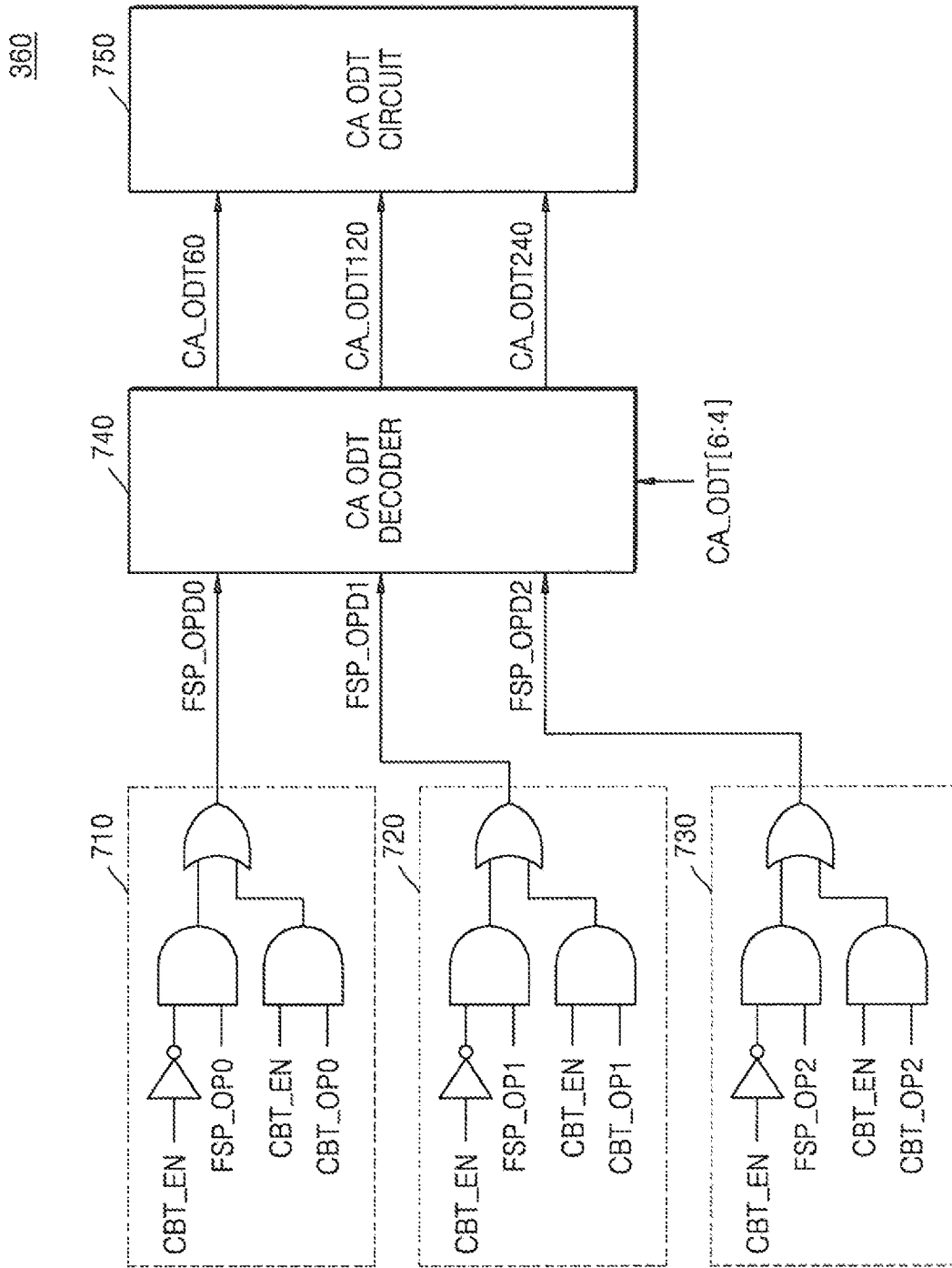

Referring to FIG. 7A, the CA ODT control circuit 360 may perform control so that ideal termination is provided to the command/address CA signal based on estimated impedance matching. The CA ODT control circuit 360 may include first to third frequency set point driving signal generators 710, 720, and 730, a CA ODT decoder 740, and a CA ODT circuit 750.

The first frequency set point driving signal generator 710 may generate a first frequency set point driving signal FSP_OPD0 in response to the CBT enable signal CBT_EN, a first frequency set point operation mode signal FSP_OP0, and a first CBT operation mode signal CBT_OP0. The first frequency set point operation mode signal FSP_OP0 corresponding to [00] of OP[3:2] setting of a mode table of the mode register 320 illustrated in FIG. 7B may represent a low frequency setting FSP[0] in the normal mode. The first CBT operation mode signal CBT_OP0 corresponding to [01] of OP[5:4] setting of the mode table of the mode register 320 may represent a low frequency setting FSP0 in the CBT mode. The first frequency set point driving signal generator 710 outputs the first frequency set point operation mode signal FSP_OP0 as the first frequency set point driving signal FSP_OPD0 in the normal mode and may output the first CBT operation mode signal CBT_OP0 as the first frequency set point driving signal FSP_OPD0 in the CBT mode. The first frequency set point driving signal FSP_OPD0 may operate as a frequency set point enable signal in accordance with a low frequency operation.

The second frequency set point driving signal generator 720 may generate a second frequency set point driving signal FSP_OPD1 in response to the CBT enable signal CBT_EN, a second frequency set point operation mode signal FSP_OP1, and a second CBT operation mode signal CBT_OP1. The second frequency set point operation mode signal FSP_OP1 corresponding to [01] of OP[3:2] setting of the mode table of the mode register 320 illustrated in FIG. 7B may represent an intermediate frequency setting FSP[1] in the normal mode. The second CBT operation mode signal CBT_OP1 corresponding to [10] of OP[5:4] setting of the mode table of the mode register 320 may represent an intermediate frequency set point FSP1 in the CBT mode. The second frequency set point driving signal generator 720 outputs the second frequency set point operation mode signal FSP_OP1 as the second frequency set point driving signal FSP_OPD1 in the normal mode and may output the second CBT operation mode signal CBT_OP1 as the second frequency set point driving signal FSP_OPD1 in the CBT mode. The second frequency set point driving signal FSP_OPD1 may operate as a frequency set point enable signal in accordance with an intermediate frequency operation.

The third frequency set point driving signal generator 730 may generate a third frequency set point driving signal FSP_OPD2 in response to the CBT enable signal CBT_EN, a third frequency set point operation mode signal FSP_OP2, and a third CBT operation mode signal CBT_OP2. The third frequency set point operation mode signal FSP_OP2 corresponding to [10] of OP[3:2] setting of the mode table of the mode register 320 illustrated in FIG. 7B may represent a high frequency setting FSP[2] in the normal mode. The third CBT operation mode signal CBT_OP2 corresponding to [11] of OP[5:4] setting of the mode table of the mode register 320 may represent a high frequency set point FSP2 in the CBT mode. The third frequency set point driving signal generator 730 outputs the third frequency set point operation mode signal FSP_OP2 as the third frequency set point driving signal FSP_OPD2 in the normal mode and may output the third CBT operation mode signal CBT_OP2 as the third frequency set point driving signal FSP_OPD2 in the CBT mode. The third frequency set point driving signal FSP_OPD2 may operate as a frequency set point enable signal in accordance with a high frequency operation.

The first to third frequency set point driving signals FSP_OPD0, FSP_OPD1, and FSP_OPD2 may be provided to the CA ODT decoder 740. The CA ODT decoder 740 may selectively enable first to third CA ODT signals CA_ODT60, CA_ODT120, and CA_ODT240 based on an activated signal among the first to third frequency set point driving signals FSP_OPD0, FSP_OPD1, and FSP_OPD2 and the CA ODT code CA_ODT[6:4].

Figures 7C, 7D:
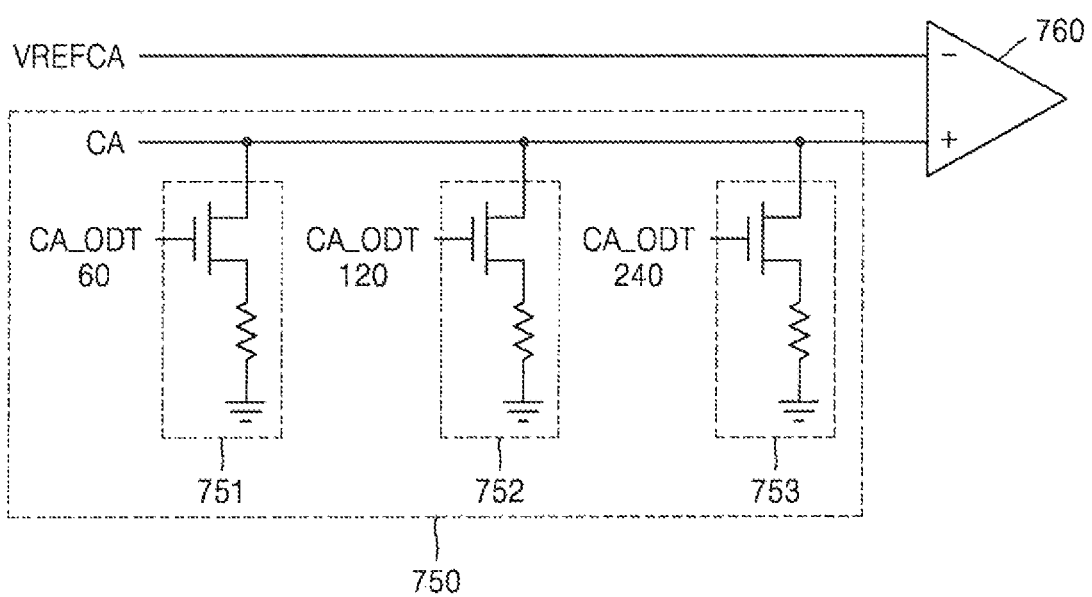

The CA ODT code CA_ODT[6:4] corresponding to OP[6:4] setting of the mode table of the mode register 320 illustrated in FIG. 7C may set a resistance value for termination of the command/address CA signal. The CA ODT code CA_ODT[6:4] may be set to be divided by a predetermined multiple with respect to a unique resistance value RZQ.

For example, the unique resistance value RZQ is about 240Ω and [001] to [110] of the CA ODT code CA_ODT[6:4] may be respectively divided by 1, 2, 3, 4, 5, and 6 with respect to the unique resistance value RZQ. The first CA ODT signal CA_ODT60 is enabled based on a CA ODT code CA_ODT[6:4] [100], the second CA ODT signal CA_ODT120 is enabled based on a CA ODT code CA_ODT[6:4] [010], and the third CA ODT signal CA_ODT240 may be enabled based on a CA ODT code CA_ODT[6:4] [001].

In FIG. 7D, the CA ODT circuit 750 may determine a termination resistance value of the command/address CA signal in response to an enabled signal among the first to third CA ODT signals CA_ODT60, CA_ODT120, and CA_ODT240. The CA ODT circuit 750 may include first to third termination circuits 751, 752, and 753.

Transistors and resistors that are respectively gated to the first to third CA ODT signals CA_ODT60, CA_ODT120, and CA_ODT240 may be respectively connected to the first to third termination circuits 751, 752, and 753. The resistors of the first to third termination circuits 751, 752, and 753 may have resistance values of 60Ω, 120Ω, and 240Ω, respectively.

The command/address CA signal terminated by the CA ODT circuit 750 to a predetermined resistance value may be provided to an input buffer 760. The input buffer 760 may receive the command/address CA signal based on the reference voltage VREFCA. The reference voltage VRECA may be output from the reference voltage setting circuit 330 illustrated in FIG. 5A.

For example, the above-described CA ODT control circuit 360 may terminate the command/address CA signal by a resistance value corresponding to the CA ODT code CA_ODT[6:4] setting after entering the CBT mode at the point in time Td1 of FIG. 3.

Figures 8A, 8B:
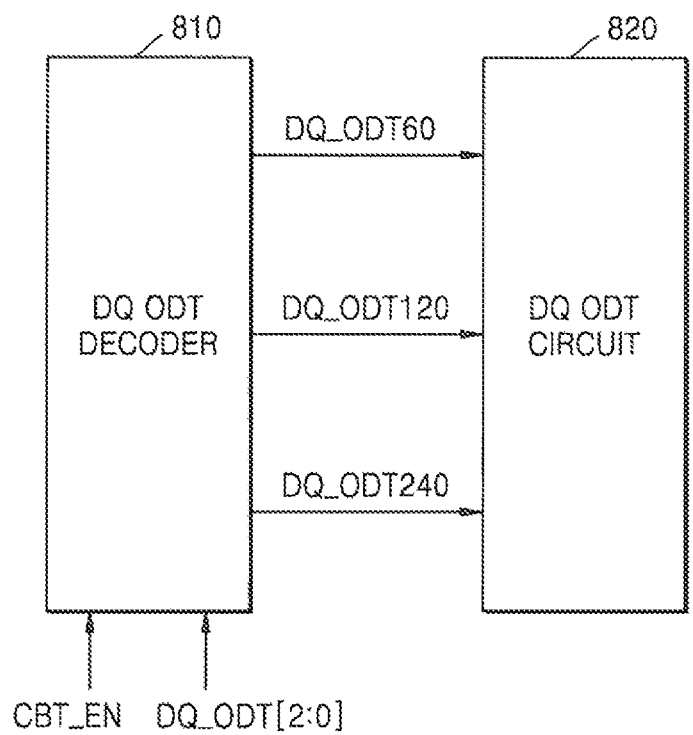
FIGS. 8A to 8C are views illustrating a DQ ODT control circuit of FIG. 2 according to an example embodiment of the inventive concept.
Figure 8C:
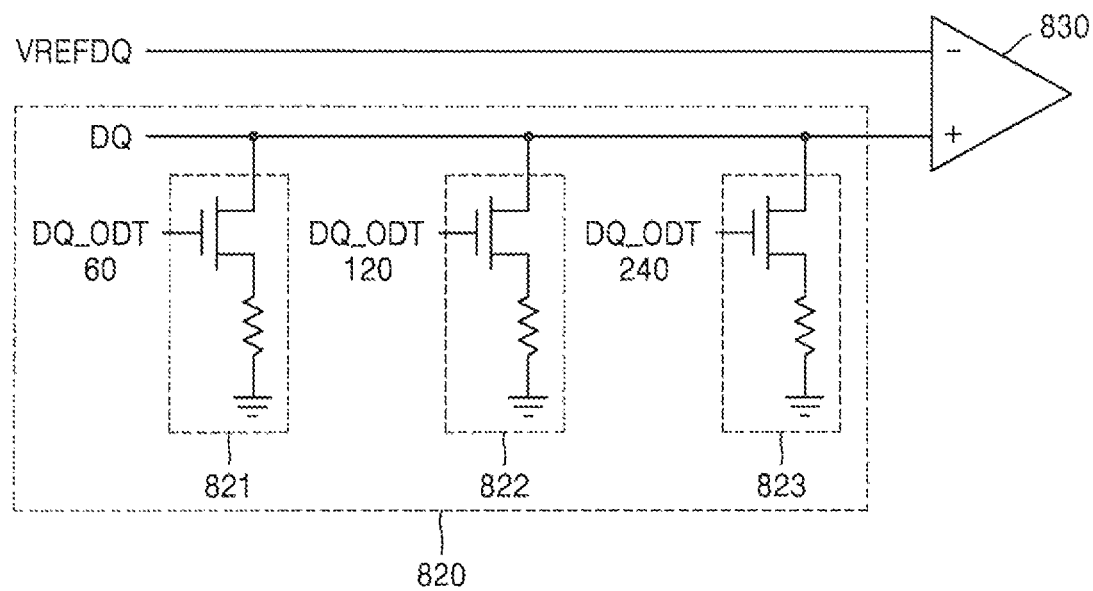

FIGS. 8A to 8C are views illustrating the data DQ ODT control circuit 370 of FIG. 2 according to example embodiments of the inventive concept.

Referring to FIG. 8A, the DQ ODT control circuit 370 may perform control so that ideal termination is provided to the data DQ based on estimated impedance matching. The DQ ODT control circuit 370 may include a DQ ODT decoder 810 and a DQ ODT circuit 820.

The DQ ODT decoder 810 may selectively enable first to third DQ ODT signals DQ_ODT60, DQ_ODT120, and DQ_ODT240 based on the CBT enable signal CBT_EN and a DQ ODT code DO_ODT[2:0]. For example, the DO ODT decoder 810 may selectively enable the first to third DQ ODT signals DQ_ODT60, DQ_ODT120, and DQ_ODT240 corresponding to the DQ ODT code DQ_ODT[2:0] in the normal mode, that is, when the CBT enable signal CBT_EN is deactivated to a logic low value.

The DQ ODT code DQ_ODT[2:0] as a signal corresponding to OP[2:0] setting of the mode table of the mode register 320 illustrated in FIG. 8B may set a resistance value for the termination of the data DQ. The DQ ODT code DQ_ODT [2:0] may be set to be divided by a predetermined multiple with respect to the unique resistance value RZQ. For example, the unique resistance value RZQ is about 240Ω, and [001] to [110] of the DQ ODT code DQ_ODT[2:0] may be divided by 1, 2, 3, 4, 5, and 6 with respect to the unique resistance value RZQ. The first DQ ODT signal DQ_ODT60 is enabled based on the DQ ODT code DQ_ODT[2:0] [100], the second DQ ODT signal DQ_ODT120 is enabled based on the DQ ODT code DQ_ODT[2:0] [010], and the third DQ ODT signal DQ_ODT240 may be enabled based on the DQ ODT code DQ_ODT[2:0] [001].

In FIG. 8C, the DQ ODT circuit 820 may determine a termination resistance value of the data DQ in response to an enabled signal among the first to third DQ ODT signals DQ_ODT60, DQ_ODT120, and DQ_ODT240. The DQ ODT circuit 820 may include first to third termination circuits 821, 822, and 823. Transistors and resistors that are respectively gated to the first to third DQ ODT signals DQ_ODT60, DQ_ODT120, and DQ_ODT240 may be respectively connected to the first to third termination circuits 821, 822, and 823. The resistors of the first to third termination circuits 821, 822, and 823 may respectively have resistance values of 60Ω, 120Ω, and 240Ω.

The data DQ terminated by the DQ ODT circuit 820 to a predetermined resistance value may be provided to an input buffer 830. The input buffer 830 may receive the data DQ based on the reference voltage VREFDQ.

For example, the DQ ODT control circuit 370 may terminate the data DQ by a resistance value enabled from the point in time Ta0 to the point in time Tb0 of FIG. 3 and corresponding to DQ ODT code DQ_ODT[2:0] setting. In the CBT mode, the DQ ODT control circuit 370 is disabled from the point in time Td1 to the point in time Tg0 of FIG. 3 and may turn off DQ ODT.

Figure 9A:
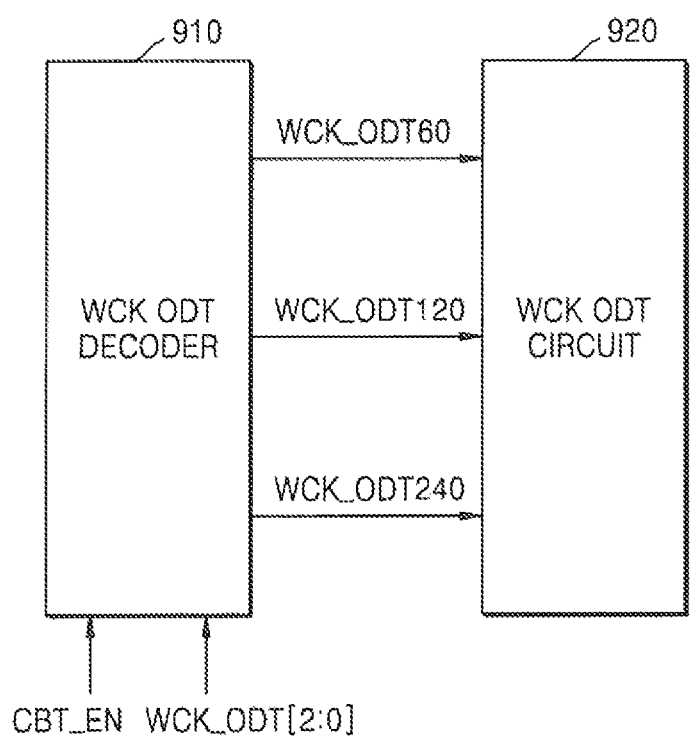
Figure 9C:
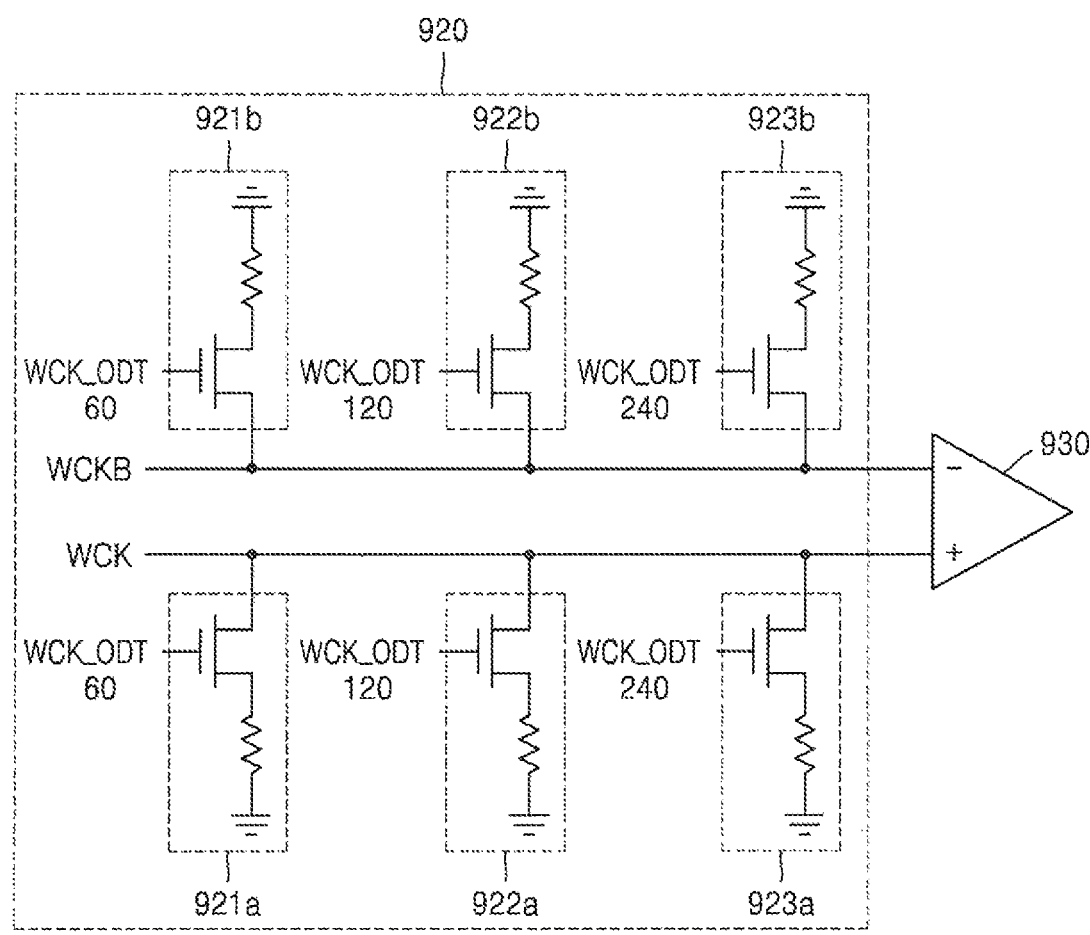

FIGS. 9A to 9C are views illustrating the WCK ODT control circuit 380 of FIG. 2 according to example embodiments of the inventive concept.

Referring to FIG. 9A, the WCK ODT control circuit 380 may perform control so that ideal termination is provided to the pair of data clock signals WCK and WCKB based on estimated impedance matching. The WCK ODT control circuit 380 may include a WCK ODT decoder 910 and a WCK ODT circuit 920.

The WCK ODT decoder 910 may selectively enable first to third WCK ODT signals WCK_ODT60, WCK_ODT120, and WCK_ODT240 based on the CBT enable signal CBT_EN and a WCK ODT code WCK_ODT[2:0].

The WCK ODT code WCK_ODT[2:0] as a signal corresponding to the OP[2:0] setting of the mode table of the mode register 320 illustrated in FIG. 9B may set a resistance value for termination of the pair of data clock WCK and WCKB signals. The WCK ODT code WCK_ODT[2:0] may be set to be divided by a predetermined multiple with respect to the unique resistance value RZQ. For example, the unique resistance value RZQ is about 240Ω and [001] to [110] of the WCK ODT code WCK_ODT[2:0] may be respectively divided by 1, 2, 3, 4, 5, and 6 with respect to the unique resistance value RZQ. The first WCK ODT signal WCK_ ODT 60 is enabled based on the WCK ODT code WCK_ ODT[2:0] [100], the second WCK ODT signal WCK_ ODT120 is enabled based on the WCK ODT code WCK_ ODT[2:0] [010], and the third WCK ODT signal WCK_ ODT240 may be enabled based on the WCK ODT code WCK_ODT[2:0] [001].

In FIG. 9C, the WCK ODT circuit 920 may determine termination resistance values of the pair of data clock signals WCK and WCKB in response to an enabled signal among the first to third WCK ODT signals WCK_ODT60, WCK_ ODT120, and WCK_ODT240. The WCK ODT circuit 920 may include first to third termination circuits 921*a*, 922*a*, and 923*a* connected to a data clock WCK line and fourth to sixth termination circuits 921*b*, 922*b*, and 923*b* connected to a complementary data clock WCKB line. A transistor and a resistor having a resistance value of 60Ω that are gated to the first WCK ODT signal WCK_ODT60 may be connected to each of the first and fourth termination circuits 921*a* and 921*b*. A transistor and a resistor having a resistance value of 120Ω that are gated to the second WCK ODT signal WCK_ODT120 may be connected to each of the second and fifth termination circuits 922*a* and 922*b*. A transistor and a resistor having a resistance value of 240Ω that are gated to the third WCK ODT signal WCK_ODT240 may be connected to each of the third and sixth termination circuits 923*a* and 923*b*.

The pair of data clock WCK and WCKB signals terminated by the WCK ODT circuit 920 to a predetermined resistance value may be provided to a clock buffer 930. The clock buffer 930 may receive a data clock WCK signal based on the pair of data clock WCK and WCKB signals.

For example, the WCK, ODT control circuit 380 may terminate the pair of data clock WCK and WCKB signals to a resistance value corresponding to the WCK ODT code WCK_ODT[2:0] setting after entering the CBT mode at the point in time Td1 of FIG. 3.

Figure 10:
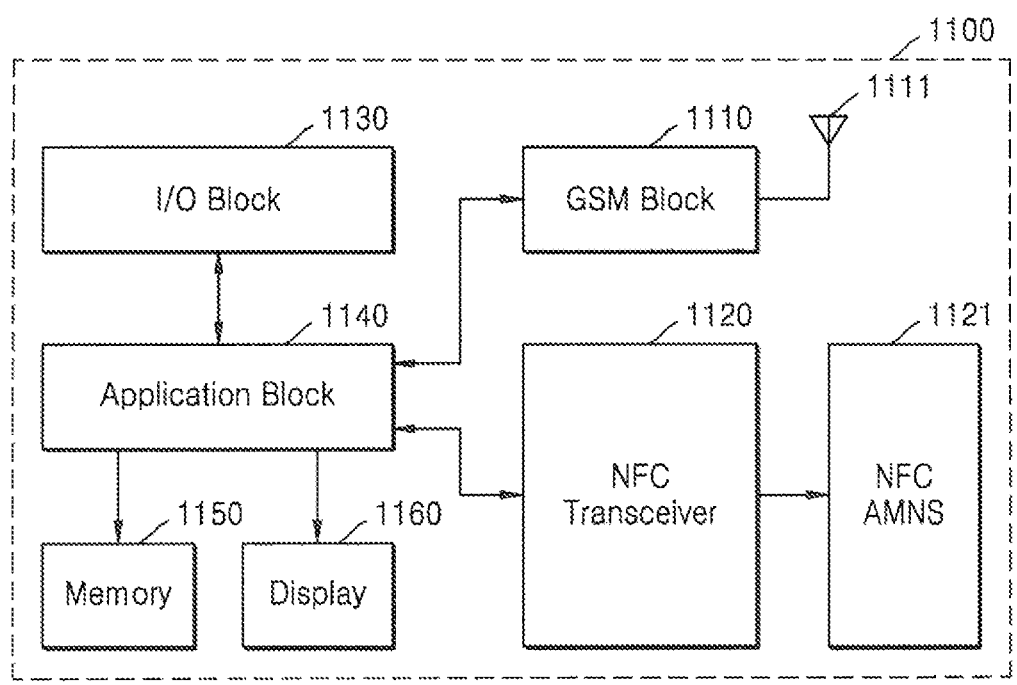
FIG. 10 is a block diagram illustrating an example in which a memory system according to embodiments of the present inventive concept is applied to a mobile device.

FIG. 10 is a block diagram illustrating an example in which a memory system according to embodiments of the present inventive concept is applied to a mobile device. The mobile device may be, for example, but is not limited to, a mobile telephone, a smart phone, a computing tablet, a wireless enabled e-reader, and/or a wearable computing device.

Referring to FIG. 10, a mobile device 1100 includes a global system for mobile communication (GSM) block 1110, a near field communication (NFC) transceiver 1120, an input and output (I/O) block 1130, an application block 1140, a memory 1150, and a display 1160. In FIG. 10, components/blocks of the mobile device 1100 are illustrated by way of example. The mobile device 1100 may include more or less components/blocks in various embodiments of the inventive concept. In addition, in the current embodiment, it is illustrated that GSM technology is used. However, the mobile device 1100 may be implemented using communication technologies including, but not limited to, code division multiple access (CDMA) technology. The blocks of FIG. 10 may be implemented in a form of an integrated circuit. Alternatively, some blocks may be implemented as integrated circuits and other blocks may be implemented in other forms.

The GSM block 1110 is connected to an antenna 1111 and may operate so as to provide wireless telephone functionality. The GSM block 1110 includes a receiver and a transmitter and may perform corresponding reception and transmission operations.

The NEC transceiver 1120 may be configured to transmit and receive NEC signals by using inductive coupling for wireless communication. The wireless communication may include a personal area network, such as Bluetooth, a local area network such as WiFi, and/or a wide area network such as WiMAX, or another wireless communication technique. The NEC transceiver 1120 provides the NFC signals to an NEC antenna matching network system (AMNS) 1121 and an NEC AMNS 1121 may transmit the NEC signals through the inductive coupling. The NEC AMNS 1121 receives the NEC signals provided from another NEC device and may provide the received NEC signals to the NEC transceiver 1120.

The application block 1140 includes hardware circuits, for example, one or more processors and may operate to provide various user applications provided by the mobile device 1100. The user applications may include voice call operations, data transmission, data swap, etc. The application block 1140 may operate together with the GSM block 1110 and/or the NFC transceiver 1120 and may provide operation characteristics of the GSM block 1110 and/or the NEC transceiver 1120. In other embodiments, the application block 1140 may include a program for mobile point of sales (POS). The program may provide a credit card purchase and payment function by using the mobile telephone, that is, the smart phone.

The display 1160 may display an image in response to display signals received from the application block 1140. The image may be generated by a camera provided by the application block 1140 or mounted in the mobile device 1100. The display 1160 includes a frame buffer to temporarily store pixel values and may include a liquid display (LD) screen together with related control circuits.

The I/O block 1130 provides an input function to a user and provides outputs to be received through the application block 1140. The I/O block 1130 represents a hardware device and software components that are related to a mutual operation with the user. The I/O block 1130 may operate to manage partial hardware of the display 1160 and/or an audio system. For example, an input through a microphone or an audio device may be provided to the application block 1140. When the display 1160 includes a touchscreen, the display 1160 may function as an input device that may be partially managed by the I/O block 1130. To provide an input and output I/O function managed by the I/O block 1130, an additional button or switch may be provided in the mobile device 1100. The I/O block 1130 may manage devices, such as an accelerometer, a camera, an optical sensor or another environment sensor, a gyroscope, a global positioning system (GPS), and other hardware that may be included in the mobile device 1100.

The memory 1150 may store programs (commands) and/or data to be used by the application block 1140 and may be implemented by random access memory (RAM), read only memory (ROM), or a flash memory. Therefore, the memory 1150 may include non-volatile storage elements as well as volatile storage elements. For example, the memory 1150 may include the memory system 1000 described with reference to FIGS. 1 to 9.

The memory 1150 may support a CBT mode that improves accuracy of the CBT. The memory 1150 may enter the CBT mode in response to a first logic level of a first data signal and may exit from the CBT mode in response to a second logic level opposite to the first logic level of the first data signal. The memory 1150 may receive a CBT pattern formed of a bit configuration of the command/address CA signals and may output the CBT pattern through terminals by way of second data signals in one-to-one correspondence with the command/address CA signals in the CBT mode. The memory 1150 may change a reference voltage value in accordance with a second reference voltage setting code received by the terminals of the second data signals, terminate the command/address CA signal to a resistance value corresponding to a CA ODT code setting stored in the mode register, terminate the pair of data clock signals WCK and WCKB to a resistance value corresponding to a WCK ODT code setting, stored in the mode register, and may turn off ODT of the data DQ signals. The first data signal may be set to one of the signals that are not the second data signals among the data signals of the memory device in the CBT mode.

While the inventive concept has been particularly shown and described with reference to embodiments thereof, it will be understood that various changes in form and details may be made therein without departing from the spirit and scope of the following claims.

What is claimed is:

1. A memory device for supporting a command bus training (CBT) mode, the memory device comprising:
a data clock signal;
command/address signals comprising a CBT pattern;
data signals including a first data signal and second data signals, the second data signals being in one-to-one correspondence with the command/address signals from which the CBT pattern is output in the CBT mode; and
a control logic configured to initiate entry into the CBT mode in response to a first logic level of the first data signal synchronized with the data clock signal and further configured to exit from the CBT mode in response to a second logic level opposite to the first logic level of the first data signal.

2. The memory device of claim 1, wherein the control logic is further configured to receive the CBT pattern through first terminals associated with the command/address signals, and to output the CBT pattern through second terminals associated with the second data signals in the CBT mode.

3. The memory device of claim 1, wherein the control logic is further configured to receive a reference voltage setting code through terminals associated with the second data signals and, to change a reference voltage value in accordance with a reference voltage setting code in the CBT mode.

4. The memory device of claim 3, wherein the control logic is further configured to compare the changed reference voltage value with a voltage level of each of the command/address signals.

5. The memory device of claim 1, further comprising a mode register configured to store an on-die termination (ODT) code of the command/address signals, an ODT code of the data signals, or an ODT code of a pair of data clock signals.

6. The memory device of claim 5, wherein the control logic is further configured to terminate a line of each of the command/address signals to a respective resistance value corresponding to setting of an ODT code of the respective command/address signals in the CBT mode.

7. The memory device of claim 6, wherein the control logic is further configured to set an ODT code of the command/address signals in relation to a frequency set point operation mode signal based on an operation frequency of the memory device in the CBT mode.

8. The memory device of claim 5, wherein the control logic is further configured to turn off ODT in a data bus to which the data signals are transmitted in the CBT mode.

9. The memory device of claim 5, wherein the control logic is further configured to terminate a data bus through which the data signals are transmitted to a resistance value corresponding to setting of an ODT code of the data signals in a normal mode in which a writing or reading operation of the memory device is performed.

10. The memory device of claim 5, wherein the control logic is further configured to terminate a line of each of the pair of data clock signals to a resistance value corresponding to setting of an ODT code of the pair of data clock signals.

11. A method of operating a memory device for supporting a command bus training (CBT) mode, the method comprising:
    receiving a data clock signal;
    entering the CBT mode in response to a first logic level of a first data signal synchronized with the data clock signal;
    receiving a CBT pattern formed of a bit configuration of command/address signals in the CBT mode;
    outputting the CBT pattern through terminals associated with second data signals, which are in one-to-one correspondence with the command/address signals, in the CBT mode; and
    exiting from the CBT mode in response to a second logic level opposite to the first logic level of the first data signal synchronized with the data clock signal,
    wherein the second data signals do not comprise the first data signal in the CBT mode.

12. The method of claim 11, further comprising receiving a reference voltage setting code through terminals associated with the second data signals and changing a reference voltage value in accordance with the reference voltage setting code in the CBT mode.

13. The method of claim 12, further comprising comparing the changed reference voltage value with a voltage level of each of the command/address signals.

14. The method of claim 11, further comprising storing an ODT code of the command/address signals, an ODT code of the data signals, or an ODT code of a pair of data clock signals in a mode register.

15. The method of claim 14, further comprising terminating a line associated with each of the command/address signals to a respective resistance value corresponding to setting of an ODT code of the respective command/address signals in the CBT mode.

16. The method of claim 15, wherein setting of the ODT code of the command/address signals comprises:
    setting the ODT code of the respective command/address signals responsive to a frequency set point operation mode signal based on an operation frequency of the memory device.

17. The method of claim 14, further comprising turning off ODT in a data bus through which the data signals are transmitted in the CBT mode.

18. The method of claim 14, further comprising terminating a data bus through which the data signals are transmitted to a resistance value corresponding to an ODT code setting of the data signals in a normal mode in which a writing or reading operation of the memory device is performed.

19. The method of claim 14, further comprising terminating a line of each of the pair of data clock signals to a resistance value corresponding to an ODT code setting of the pair of data clock signals in the CBT mode.

20. A memory system comprising:
    a memory device configured to enter a command bus training (CBT) mode or exit from the CBT mode in response to a logic level of a first data signal; and
    a memory controller configured to transmit a CBT pattern to the memory device through terminals associated with command/address signals,
    wherein second data signals for outputting the CBT pattern in the CBT mode are in one-to-one correspondence with the command/address signals and do not comprise the first data signal in the CBT mode, and
    wherein the memory device is further configured to change a reference voltage value in accordance with a second reference voltage setting code received by terminals associated with the second data signals, to terminate the command/address signals or a pair of data clock signals to a resistance value corresponding to an ODT code setting stored in a mode register, and to turn off ODT of the data signals in the CBT mode.

* * * * *